(12) United States Patent
Takahashi et al.

(10) Patent No.: US 7,555,212 B2
(45) Date of Patent: Jun. 30, 2009

(54) BATTERY CHECK DEVICE

(75) Inventors: Hiroyuki Takahashi, Tochigi (JP); Yutaka Ohsawa, Tokyo (JP)

(73) Assignee: Hoya Corporation, Tokyo (JP)

( * ) Notice: Subject to any disclaimer, the term of this patent is extended or adjusted under 35 U.S.C. 154(b) by 349 days.

(21) Appl. No.: 11/424,345

(22) Filed: Jun. 15, 2006

(65) Prior Publication Data

US 2006/0291848 A1    Dec. 28, 2006

(30) Foreign Application Priority Data

Jun. 24, 2005    (JP) .............................. 2005-184552

(51) Int. Cl.
G03B 7/26    (2006.01)
H02J 7/00    (2006.01)
(52) U.S. Cl. ...................... 396/279; 320/106
(58) Field of Classification Search ......... 396/277–279, 396/301; 320/106, 135; 348/372
See application file for complete search history.

(56) References Cited

U.S. PATENT DOCUMENTS

| | | | | |
|---|---|---|---|---|
| 5,600,228 A | * | 2/1997 | Matsubayashi et al. | 320/155 |
| 5,777,442 A | * | 7/1998 | Miyata | 318/2 |
| 6,134,391 A | * | 10/2000 | Takahashi | 396/277 |
| 6,674,956 B1 | | 1/2004 | Takahashi | |
| 6,989,758 B2 | | 1/2006 | Kurosawa | |
| 2001/0045813 A1 | * | 11/2001 | Suzuki et al. | 320/110 |

* cited by examiner

*Primary Examiner*—Christopher E Mahoney
*Assistant Examiner*—Minh Phan
(74) *Attorney, Agent, or Firm*—Greenblum & Bernstein, P.L.C.

(57) ABSTRACT

A battery check device for a portable electronic apparatus, such as a digital camera, for example, can selectively use a plurality of types of batteries. The battery check device comprises a battery determining processor that determines a type of battery, when the battery is mounted in the portable electronic apparatus. A battery check processor is provided for checking the residual battery power in accordance with the determined battery type for the mounted battery. An indicating processor indicates the plurality of types of batteries that can be mounted in the portable electronic apparatus. The indicating processor further indicates the determined battery type.

3 Claims, 7 Drawing Sheets

BATTERY CHECK DEVICE

BACKGROUND OF THE INVENTION

1. Field of the Invention

The present invention relates to a battery check device for a portable electronic apparatus such as a digital camera, and, more particularly, to a battery check device, which checks the residual power of a battery mounted as an electric power source for the portable electronic apparatus.

2. Description of the Related Art

Conventionally, there is known a digital camera, in which a plurality of types of batteries, such as alkaline size AA battery or nickel hydrogen battery, can be selectively mounted. Such a digital camera is constructed, assuming that the regular voltages of the plurality of types of batteries are different, in such a manner that a type of battery is input through a menu plane, for example, so that a control corresponding to the battery can be performed. Namely, for example, when the residual battery power becomes less than 1.2V, if a nickel hydrogen battery is mounted, a regular operation can be carried out, but if an alkaline size AA battery is mounted, it is determined that the battery is exhausted, so that a photographing operation or so on cannot be carried out.

Thus, in a conventional digital camera, since the residual battery power is checked based on predetermined types of batteries, if the user inputs a wrong type of battery through a menu plane, depending upon the type of battery selected, the battery can be deemed to be exhausted, so that the digital camera may become inoperative, even if a regular operation could actually be performed.

SUMMARY OF THE INVENTION

Therefore, an object of the present invention is to provide a battery check device, which can always operate a portable electronic apparatus normally, even if a type of battery different from a predetermined type of battery were mounted.

According to the present invention, there is provided a battery check device for a portable electronic apparatus, in which a plurality of types of batteries can be selectively mounted. The battery check device comprises a battery determining processor, a battery check processor, and an indicating processor.

The battery determining processor determines a type of battery, when the battery is mounted in the portable electronic apparatus. The battery check processor checks the residual battery power in accordance with the determined battery type, for the mounted battery. The indicating processor can indicate the plurality of types of batteries, and indicates the determined battery type.

BRIEF DESCRIPTION OF THE DRAWINGS

The objects and advantages of the present invention will be better understood from the following description, with reference to the accompanying drawings in which.

DESCRIPTION OF THE PREFERRED EMBODIMENTS

Figure 1:
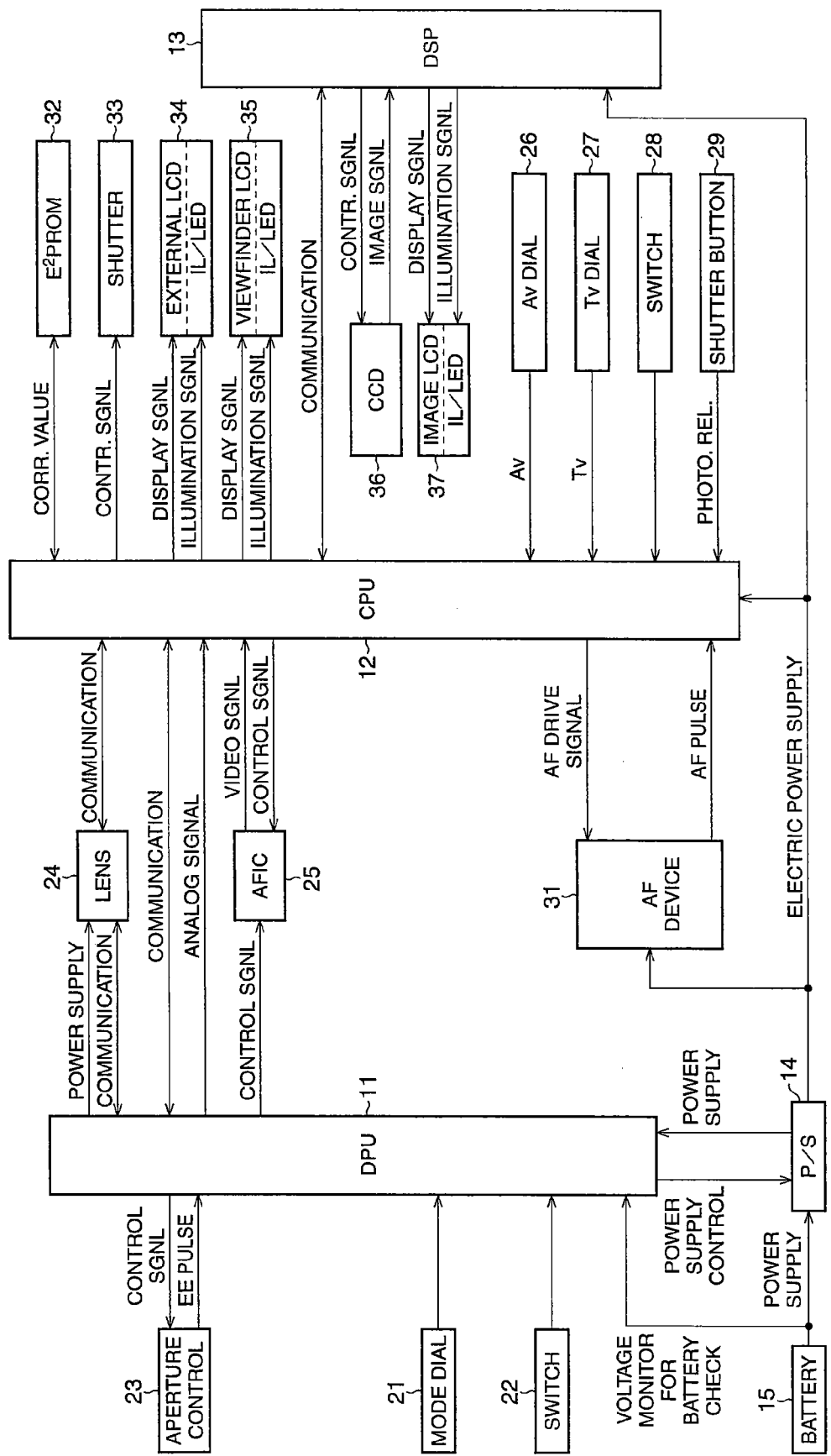
FIG. 1 is a block diagram generally showing an electric structure of a digital camera, in which a battery check device of an embodiment of the present invention is provided.

The present invention will be described below with reference to embodiments shown in the drawings.

FIG. 1 indicates an electric structure of a digital camera, in which a battery check device of an embodiment of the present invention is provided.

The digital camera has a first control circuit (DPU) 11, a second control circuit (CPU) 12, and a data process circuit 13. Electric power is supplied to these circuits 11, 12, and 13 by a battery 15 through an electric power supply circuit 14. For the battery 15, a plurality of types, such as an alkaline size AA battery, a nickel hydrogen battery, or a size AA lithium battery, can be used. Namely, one of these batteries is selected by the user, and is mounted in a battery chamber (not shown) of the camera.

To the first control circuit 11, signals indicating an exposure mode, ISO sensitivity, white balance information, and so on are input through a mode dial 21, and signals indicating operation modes and so on are input through a first switch 22 such as a four direction key, an execution button, an AF button, and so on. Based on these signals, the first control circuit 11 feedback-controls an aperture value through an aperture control circuit 23, supplies electric power to a lens 24, and drives an AF sensor (AFIC) 25.

To the second control circuit 12, an Av dial 26, a Tv dial 27, switches 28 including a main switch, and a shutter button 29 are connected. The electric power supply circuit 14 is activated by operating the main switch, so that the digital camera becomes operable. To the second control circuit 12, information of a set value of the aperture is input from the Av dial 26, and information of a set value of the shutter speed is input from the Tv dial 27. Further, by operating the shutter button 29, a command signal of photometry or a shutter release is input. Note that, when the shutter button 29 is partly depressed, the photometry switch is turned on, and when the shutter button 29 is felly depressed, the release switch is turned on.

An AF device 31 containing an AF motor and so on is operated by supplying electric power from the electric power supply circuit 14, to output an AF pulse due to an AF drive signal, which is output from the second control circuit 12 in accordance with an output signal of the AF sensor 25, when the shutter button 29 is operated. Thus, the lens 24 is actuated, so that an AF operation is carried out.

Further, to the second control circuit 12, an EEPROM 32, a shutter 33, an external display device 34, and a view finder display device 35 are connected. In the EEPROM 32, data such as various kinds of correction values necessary for a control of the digital camera are stored. The shutter 33 is opened and closed by the control circuit 12. The external display device 34 is provided on an upper surface of the camera body, and has an external display LCD and an illumination LED. The external display device 34 is controlled by the second control circuit 12 to display photographing information, including the photometry result. The viewfinder display device 35 is controlled by the second control circuit 12 to display the photographing information in the viewfinder.

In the data process circuit 13, a CCD 36 and a monitor 37 are provided. In the CCD 36, a subject image obtained through the lens 24 is generated. The subject image is indicated on the monitor 37, in which a menu plane can be displayed.

Figure 6:
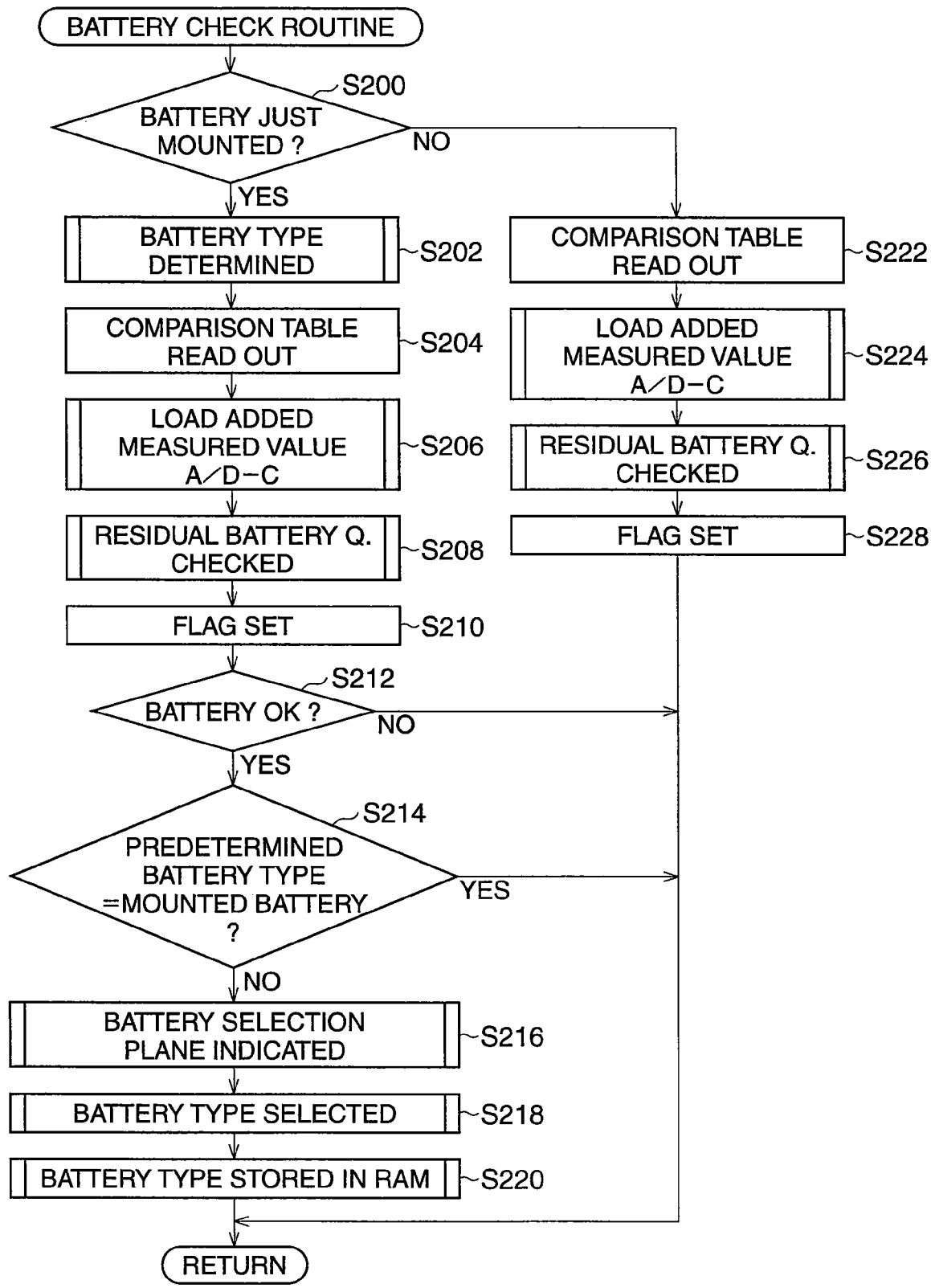
FIG. 6 is a flowchart of a battery check routine.

With reference to FIGS. 2 through 6, controls of the digital camera are described below. FIGS. 2 through 5 are flowcharts of the whole process routine of the digital camera, and FIG. 6 is a flowchart of the battery check process routine. These routines are executed by the second control circuit 12.

The whole process routine is activated every time the battery 15 (see FIG. 1) is changed. Steps S100 through S122 are executed when the main switch is turned off. When the main switch is changed to the on state, the process goes from Step S116 to Step S126, so that the photometry-timer-off loop (Steps S128 through S146) is executed. The photometry-timer-off loop is a waiting state in which photographing operations are not performed. During the loop, if the shutter button 29 or the switch 28 is operated, the process goes from Step S144 to Step S148, so that a photometry operation is performed.

When the whole process routine is actuated, first, in Step S100, a hardware initialization is performed. Namely, initialization for each port of the control circuits 11 and 12, for example, is performed. In Step S102, software initialization is performed, in which any stored contents of the RAM are cleared, and various correction values are read from the EEPROM 32 and stored in the RAM.

In Step S104, a battery-just-on flag is set. This flag indicates that the state is immediately after the battery 15 is changed or mounted. In Step S106, a battery check is carried out for the first time after the battery has been changed, so that the residual power of the battery, which is mounted at that time, is checked. This check operation will be described later with reference to FIG. 6. In Step S108, the battery-just-on flag is reset.

In Step S110, electric power is turned off. Step S110 is executed before the start of the main-switch-off loop, described later, and when the main switch is turned off during various kinds of operations. Due to Step S110, the photometry timer is turned off. In Step S112, the LCDs of the external display device 34 and the viewfinder display device 35 are turned off.

Then, the main-switch-off loop of Steps S114 through S122 is executed. In Step S114, on-off information for all the switches, including the main switch, the photometry switch, and the release switch, is input. In Step S116, it is determined whether the main switch is set to the on state. If the main switch is set to the off state, Steps S114 through S122 are repeatedly executed, and if the main switch is turned on, the process goes to Step S126.

In Step S118, the 250 ms timer is interruptedly set. In Step S120, the control circuit 12 is set to standby mode in order to suppress consumption of electric current. In Step S122, the control circuit 12 is actuated after 250 ms have elapsed since the timer interruption set was executed in Step S118, and the process returns to Step S114. Namely, once every 250 ms, the main-switch-off loop is executed so that the on-off state of the main switch is checked.

In Step S126, the battery check is carried out in a similar manner as Step S106, and the photometry-timer-off loop of Steps S126 through S146 is then performed. In Step S128, a number of photographable frames, a battery condition, an image size, and white balance information are displayed by the external display device 34. In Step S130, on-off conditions of all the switches, including the main switch, the photometry switch, and the release switch are input. In Step S132, it is determined whether the main switch is set to the on state. If the main switch is set to the off state, the process goes back to Step S110, and the main-switch-off loop is again executed.

Conversely, if it is determined in Step S132 that the main switch is set to the on state, the process goes to Step S134, in which the CPU-lens communication is carried out, so that various lens information, stored in the ROM of the lens 24, is input. In Step S136, the CPU-DSP communication is carried out. Namely, camera information, such as switch information, the battery condition, and an exposure control, is transmitted to the third control circuit (DSP) 13, and DSP information, such as the number of photographable frames, is input from the third control circuit 13.

In Step S138, interruptions by the photometry switch, the menu switch, and so on, are permitted. In Step S140, the 250 ms timer is interruptedly set. In Step S142, for suppressing the consumption current, the control circuit 12 is set to the standby mode. In Step 144, it is determined whether an interruption has been caused by the photometry switch. If an interruption of the photometry switch has occurred, the process goes to Step S148. Conversely, if an interruption has not occurred, the process goes to Step S146, in which case the control circuit 12 is actuated after 250 ms have elapsed since the timer interruption of Step S140, and the process returns to Step S128. Thus, the photometry-timer-off loop is executed every 250 ms, so that the on-off conditions of the main switch and the photometry switch are checked.

When the photometry switch is turned on, so that it is determined in Step S144 that an interruption of the photometry switch has occurred, Step S148 is executed, where a battery check is carried out in a similar way as Step S106. Then, in Step S150, based on the result of the battery check, it is determined whether the battery can be used. If the battery can be used, the process goes to Step S152, and if the battery cannot be used, the process returns to Step S128. Namely, if the battery cannot be used, the photometry-timer-off loop is again executed, so that, in Step S128, the battery condition at that time is displayed by the external display device 34.

If the battery can be used, Step S152 is executed, in which case the electric power source used for the photometry, the distance measurement, and illumination for the LCD are turned on. In Step S154, the photometry timer is started, and the photometry-timer-on loop is executed.

In the photometry-timer-on loop, first, Step S156 is executed, where on-off information for all the switches, including the main switch, the photometry switch, and the release switch, is input. Then, it is determined in Step S158 whether the main switch is set to the on state. If the main switch is set to the off state, the process returns to Step S110, so that the main-switch-off loop is again executed.

Conversely, if it is determined in Step S158 that the main switch is set to the on state, Step S160 is executed, where the CPU-lens communication is carried out, so that various lens information, stored in the ROM of the lens 24, is input. In Step S162, a photometry value (Bv value) obtained by a photometry sensor (not shown) is A/D-converted. In Step S164, exposure (AE) calculation is carried out based on the lens information and the A/D-converted Bv value, so that shutter speed and the aperture value are obtained.

In Step S166, it is determined whether the menu switch is set to the on state. If the menu switch is set to the on state, Step S170 is executed after Step S168 has been executed, and if the menu switch is set to the off state, Step S168 is skipped, so that the process goes directly to Step S170. In Step S168, the type of battery is changed in accordance with the displayed contents of the menu plane, and various kinds of set values, including image quality, are modified. In Step 170, CPU-DSP communication is carried out, so that the photometry value, the lens data, and so on are transmitted to the third control circuit (DSP) 13, and the DSP information, such as the number of photographable frames and white balance information is input from the third control circuit (DSP) 13.

In Step S172, information, such as the photometry values (Tv value, Av value), the number of photographable frames, the battery condition, and so on, is displayed in the external display device 34, and the viewfinder display device 35. In Step S174, it is determined whether the post-photography loop is being carried out at present. The post-photography loop is an operation that is performed immediately after Steps S196 and S198, to be described later, are executed, so that a photographing operation is performed, and the 3-second timer is started. The post-photography loop continues until the 3-second timer has measured 3 seconds, and while the post-photography loop is being executed, the process goes from Step S174 to Step S176, where a photographed image is displayed on the monitor 37 as a preview image. Conversely, when the post-photography loop is not being executed, Step S176 is not executed.

In Step S178, a 125 ms timer is started, and in Step S180, an interruption by the release switch is permitted. In Step S812, it is determined whether 125 ms have elapsed since the timer started at Step S178. If 125 ms have elapsed, the process returns to Step S156. Accordingly, Steps S156 through S182 are executed in a period of 125 ms.

If it is determined in Step S182 that 125 ms have not elapsed, Step S184 is executed, in which it is determined whether a set time period of the photometry timer, started at Step S154, has elapsed. The set time period of the timer started at Step S154 is 10 seconds, and the set time period of the timer started at Step S198 is 3 seconds. Namely, in Step S184, before a photographing operation is carried out (i.e., while the shutter button 29 is partly depressed), the process goes to Step S124 if 10 seconds have elapsed from the start of the timer at Step S154, and immediately after a photographing operation (Step S196) is carried out, the process goes to Step S124 if 3 seconds have elapsed from the start of the timer at Step S198. In Step S124, the electric power source is turned off, and the photometry timer is turned off. Then, after a battery check is performed in Step S126, the photometry-timer-off loop is executed.

When it is determined in Step S184 that the set time period of the photometry timer has not elapsed, Step S186 is executed, in which it is determined whether the photometry switch is in the on state. If the photometry switch is in the on state, an auto-focus adjustment (AF adjustment) is carried out in Step S188, so that the distance measurement is performed and the lens 24 is driven in accordance with the result of the distance measurement. Conversely, if the photometry switch is in the off state, or if the AF adjustment of Step S188 ends, Step S190 is executed, in which it is determined whether the release interruption has occurred. If the release switch is turned on (i.e., if the shutter button 29 is fully depressed), the process goes to Step S192, but while the release switch is turned off, the process keeps returning to Step S182.

Namely, the loop of Steps S182 through S190 is repeatedly executed for 125 ms, and during the execution of the loop, the AF adjustment (Step S188) can be carried out, and every time 125 ms have elapsed, the process returns from Step S182 to Step S156, so that the photometry operation is carried out.

In Step S192, a battery check is carried out in a similar manner as in Step S106. In Step S194, based on the result of the battery check, it is determined whether the battery can be used. If the battery cannot be used, the process goes to Step S124, and if the battery can be used, the process goes to Step S196, where a photographing operation is performed. Namely, the photographing calculation is carried out, and an exposure operation to the CCD 36 is performed in accordance with the result of the photographing calculation. In Step S198, the 3-second timer for setting the image display of Step S176 is started, and the process returns to Step S156.

With reference to FIG. 6, the process of the battery check routine is described below.

In Step S200, it is determined whether the state is immediately after the battery has been mounted. If Step S104 has been executed in the whole process routine to set the battery-just-on flag (i.e., if the battery check routine was executed in Step S106), Step S202 is executed. Conversely, if the battery-just-on flag has not been set (i.e., if the battery check routine was executed in Step S126, S148, or S192), Step S222 is executed.

In Step S202, a type of battery, mounted at that time, is automatically determined. For this determination process, for example, a relationship between the amount of load to the battery and the voltage is measured beforehand to make a load characteristics curve for every type of battery. In the determination process, data, obtained by giving different loads to the mounted battery, is compared with the load characteristics curve.

In Step S204, in accordance with the type of battery determined in Step S202, a comparison table for carrying out the residual battery power (or residual voltage) is read out from the EEPROM 32. In Step S206, the battery voltage is measured in a state, in which a load is added to the battery, and the measured data is A/D-converted. In Step S208, using the comparison table and the measured value obtained in Step S206, the residual battery power is checked in accordance with the determined battery type for the mounted battery.

For example, if a nickel hydrogen battery is mounted, the voltage level is determined as "half-reduction level" if the residual voltage is 1.1-1.0V, the voltage level is determined as "warning level" if the residual voltage is 1.0-0.9V, and the voltage level is determined as "lock level" if the residual voltage is lower than 0.9V. On the other hand, if an alkaline size AA battery is mounted, the voltage level is determined as "half-reduction level" if the residual voltage is 1.4-1.3V, the voltage level is determined as "warning level" if the residual voltage is 1.3-1.2V, and the voltage level is determined as "lock level" if the residual voltage is lower than 1.2V.

The "half-reduction level" means that, although the residual battery power has no difficulty in performing a regular photographing operation, the photographing operation cannot be performed for a long time. The "warning level" means that it is difficult to perform a photographing operation such as flash photography, for which the consumption of current is great, and that the battery should be changed. The "lock level" means that a photographing operation cannot be carried out.

In Step S210, a flag corresponding to the result of the residual battery power check of Step S208 is set. In Step S212, it is determined whether the mounted battery can be used, or whether the residual voltage is greater than the "warning level". In Step S214, by referring to data stored in the RAM, it is determined whether one of the predetermined types of batteries coincides with the type of battery determined in Step S202. If one of the predetermined types of batteries coincides with the type of the mounted battery, this battery check routine ends, and if not, the process goes to Step S216.

In Step S216, a menu plane is indicated on the monitor 37. The menu plane contains a battery selection plane for selecting a type of battery. In the battery selection plane, a predetermined type of battery is displayed together with the type of the actually mounted battery, which has been automatically determined in Step S202.

Figure 7:
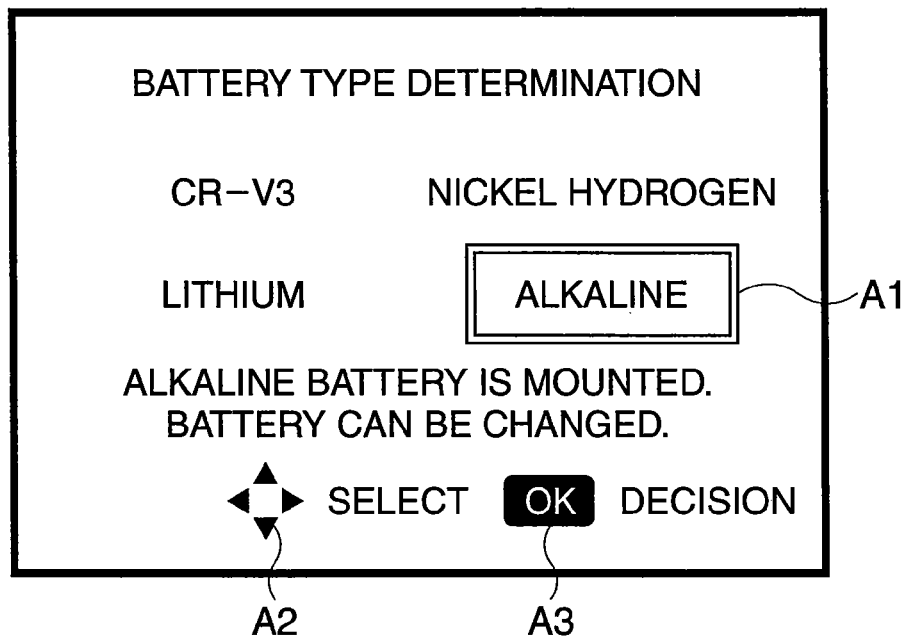
FIG. 7 is a view showing a screen displaying types of batteries, which can be used.

In the initial plane of the menu plane, the type of the actually mounted battery is indicated as the predetermined type of battery. As shown in FIG. 7, all types of batteries that can be used for the digital camera are indicated, and the type of battery, which is automatically determined in Step S202, is emphasized by enclosing its name with a frame A1. In the example shown in FIG. 7, it is shown that the actually mounted battery is an alkaline battery. Namely, since all types of the usable batteries are listed, and the automatically determined battery type is emphasized, the type of the actually mounted battery is easily recognized. Further, types of batteries other than the automatically determined battery type are indicated without using the frame A1, so that it is easily understood that the automatically determined battery can be replaced with one of these battery types.

In the menu plane, under the indicating area for the battery types, a four-direction-key mark A2 indicating that a battery type can be changed by operating the four-direction-key, and a decision key mark A3 indicating that the usage of the battery, emphasized by the frame A1, can be confirmed by pressing the decision key, are displayed.

Figure 8:
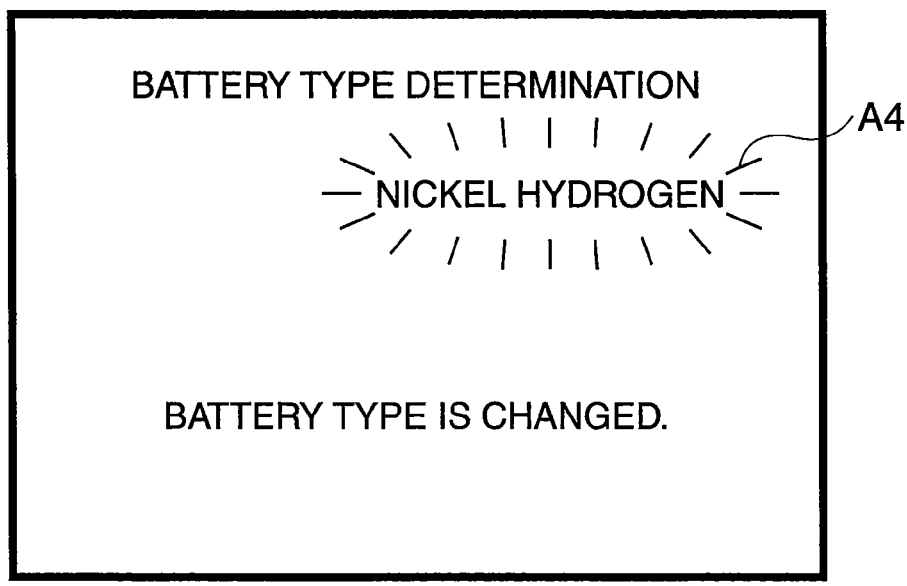
FIG. 8 is a view showing a screen when the type of battery is changed.

In Step S218, the user operates the four-direction-key with reference to the menu plane, so that the frame A1 moves onto portions one by one where the characters indicating the battery type are shown, and thus, the type of battery is selected. Then, if the decision button is depressed while the frame A1 is placed at a desired battery type, the battery type is confirmed, so that a plane shown in FIG. 8 is displayed, where the name of the newly fixed battery type blinks on and off for 3 seconds, for example (see reference A4).

In Step S220, the battery type selected in Step S218 is stored in the RAM (or flash memory), and the selected battery type is set as a type of battery to be used for the digital camera. Namely, due to the execution of Steps S216, S218, and S220, first, an automatically determined battery type is indicated and emphasized on the menu plane, so that the type of the actually mounted battery is confirmed by the user. Then, the emphasized battery type is manually changed by the user, so that the digital camera recognizes the changed battery type as the mounted battery type. Thus, a battery type other than the determined battery type can be set as the mounted battery type.

Note that, in Step S218, only when it is automatically determined that a battery, other than a battery in which the lock level is the lowest (a nickel hydrogen battery), is mounted, a battery to be mounted can be manually changed to a battery that has the lower lock level. In this embodiment, a CR-V3, a lithium battery, and an alkaline battery can be changed only to a nickel hydrogen battery. FIG. 8 shows a case in which, although the actually mounted battery is an alkaline battery, the user intentionally selects a nickel hydrogen battery.

On the other hand, if it is determined in Step S200 that the state is not immediately after the battery has been mounted, the process goes to Step S222. The instructions of Steps S222, S224, S226, and S228 are the same as those of Steps S204, S206, S208, and S210.

Figure 2:
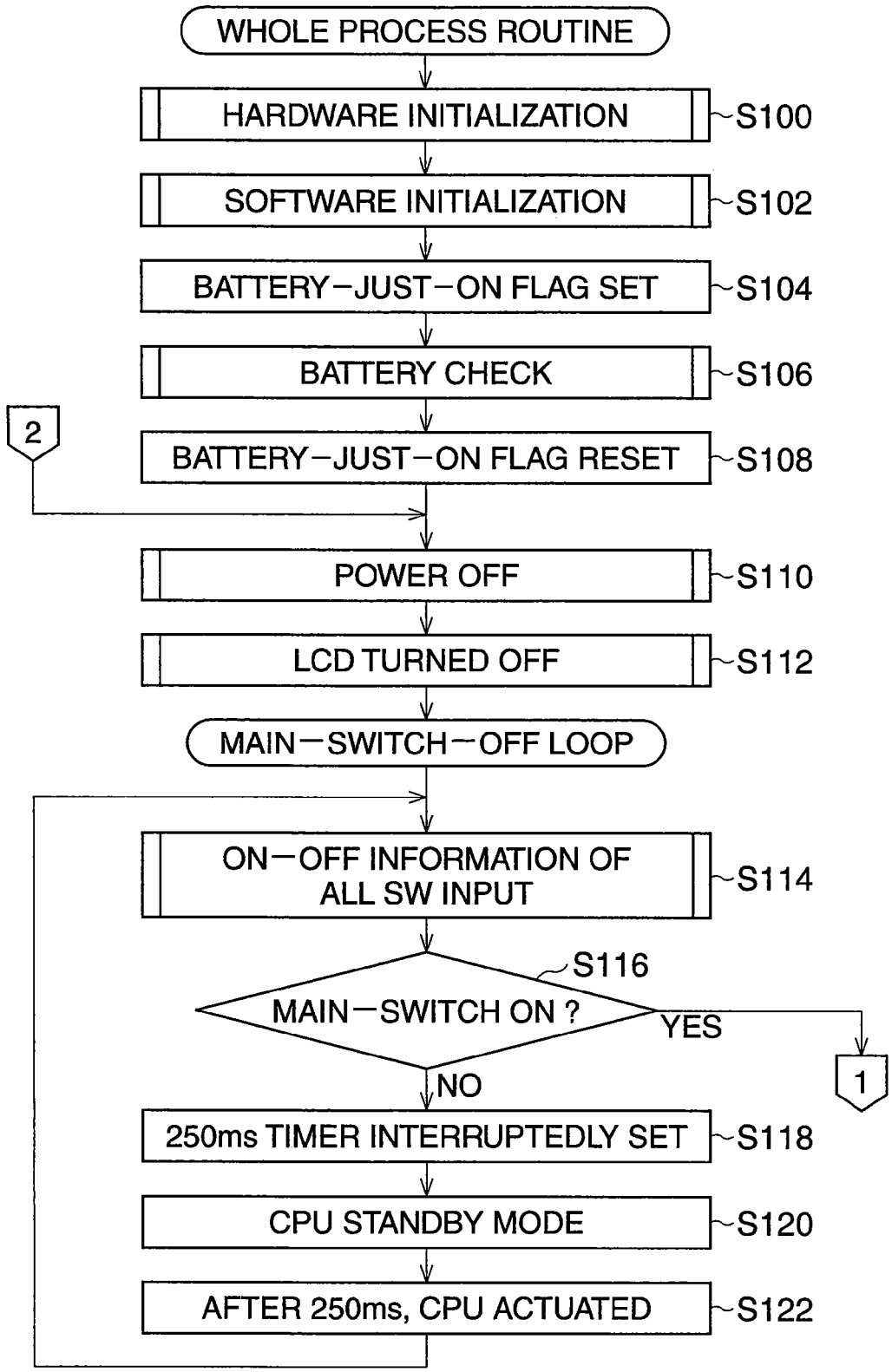
FIG. 2 is a flowchart showing controls containing a main-switch-off loop, in the whole process routine.
Figure 3:
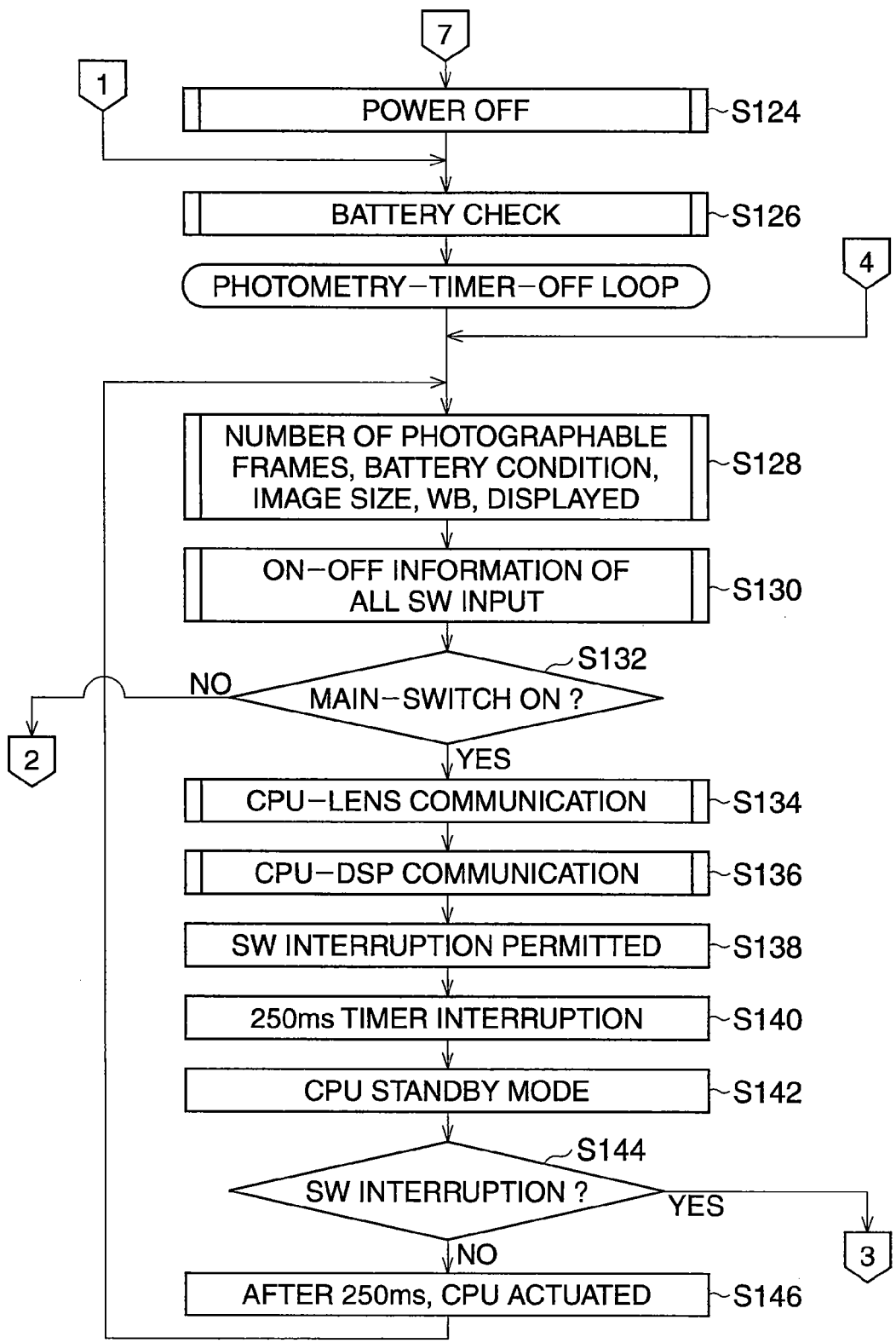
FIG. 3 is a flowchart showing controls containing a photometry-timer-off loop, in the whole process routine.
Figure 4:
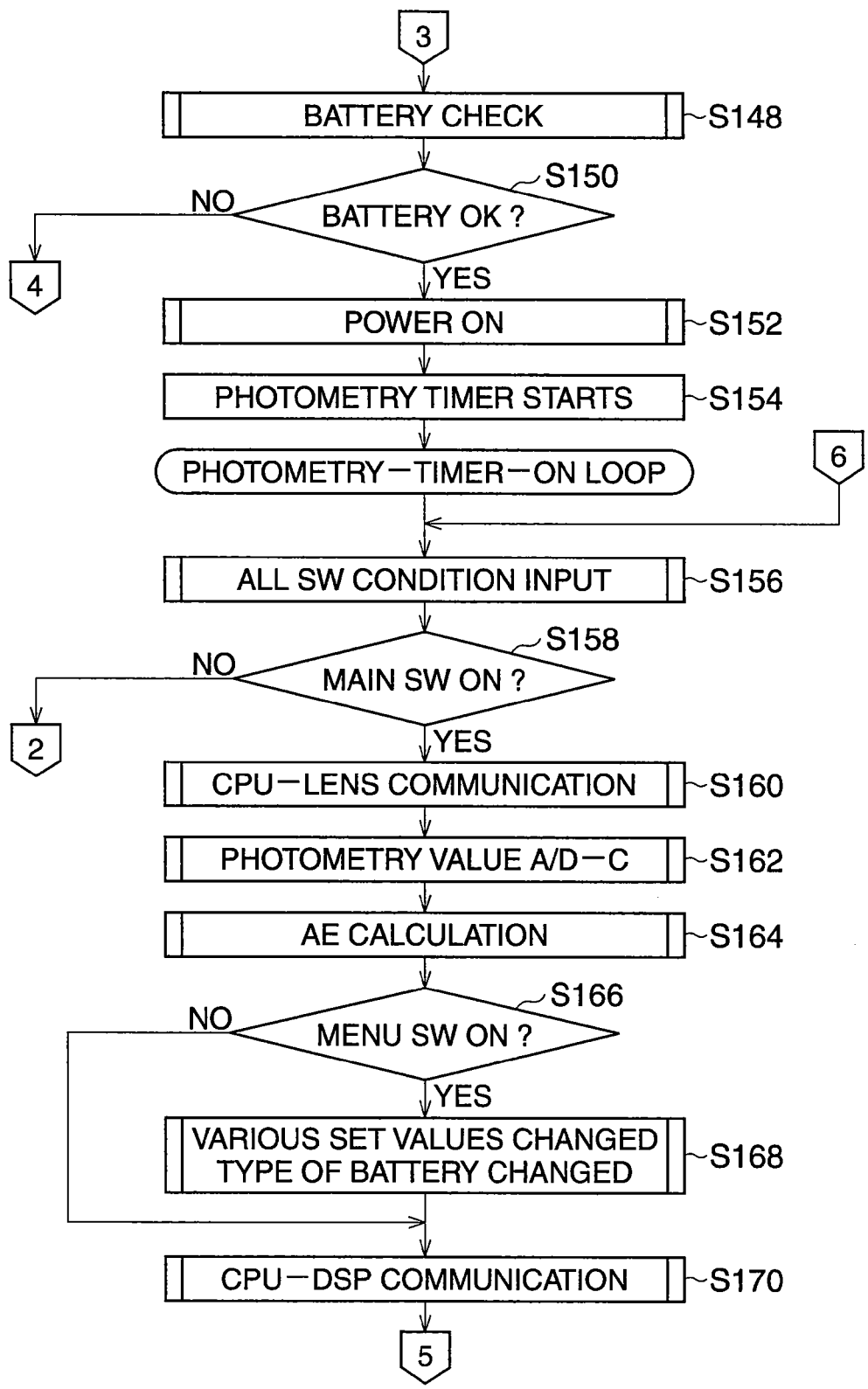
FIG. 4 is a flowchart showing controls of the former half part of a photometry-timer-on loop, in the whole process routine.
Figure 5:
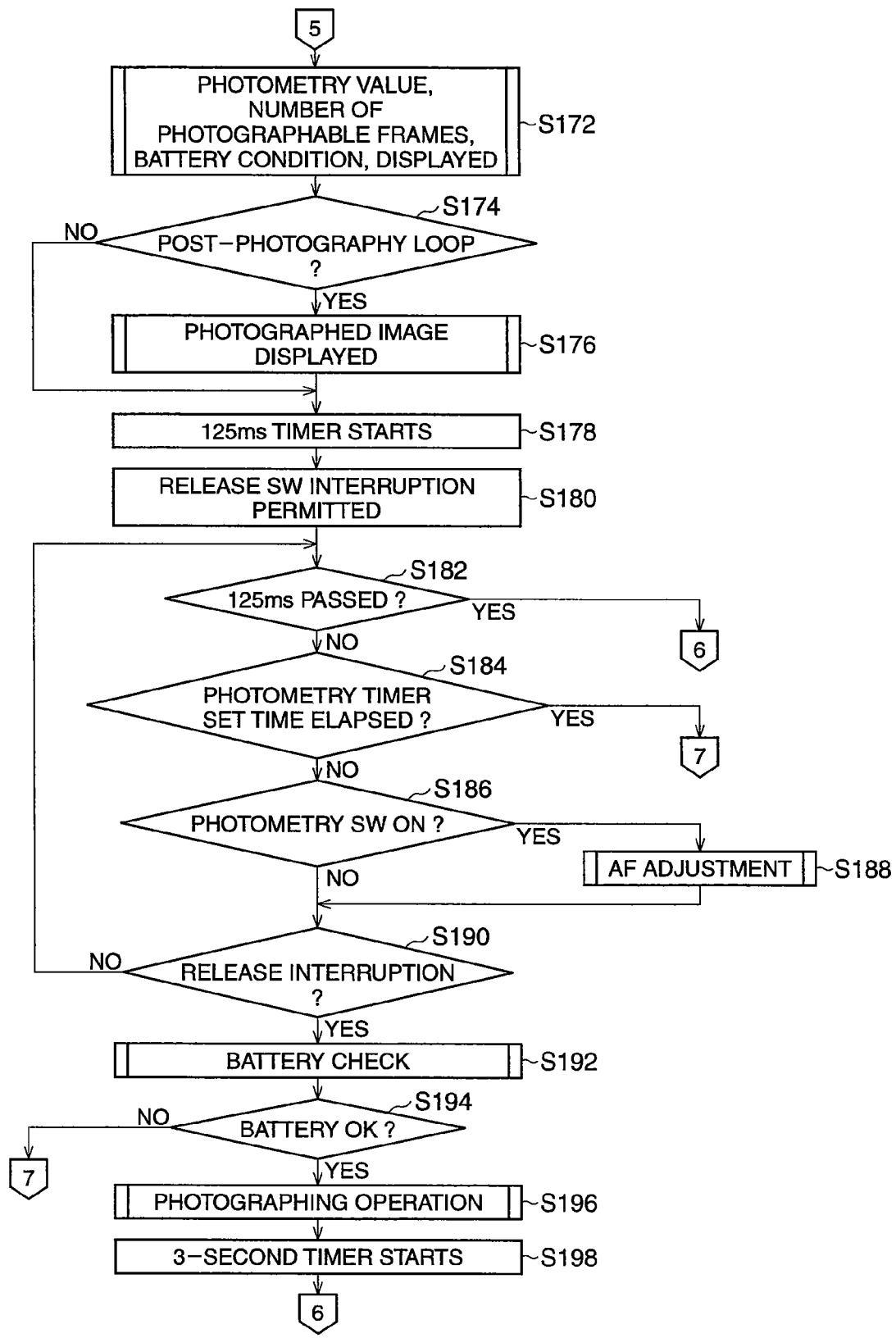
FIG. 5 is a flowchart showing controls of the latter half part of the photometry-timer-on loop, in the whole process routine.

As described above, in the embodiment, if a battery is mounted in the digital camera, in Step S106 of FIG. 2, Steps S202 through S220 of the battery check process are executed. Namely, in every case, the type of the mounted battery is automatically determined, and the residual battery power is measured. Further, when the mounted battery can be used, in Step S214, it is determined whether one of the predetermined types of batteries coincides with the type of the mounted battery, and if not, or if the predetermined battery types are incorrect, the user can correct the type of batteries stored in the RAM. Due to this, the following battery check process (Steps S126, S148, and S192) is always performed properly, so that the digital camera performs properly.

Thus, according to the embodiment, even if the predetermined battery types are incorrect, a situation in which the powering-on of the digital camera and the change of the battery are impossible because the residual battery power is not checked is prevented.

Further, in the embodiment, a battery that is not actually mounted may be compulsorily recognized as the actually mounted battery in Step S218. Therefore, for example, by setting a battery type with a relatively lower lock level than that of the battery actually mounted, the possibility determining in Step S228 that the voltage level has been lowered to the lock level of the actually mounted battery type is lowered, and further, the battery use can be maximized. Usually, the ending voltage (the voltage at which the battery becomes unusable) leaves a margin to some extent for safety's sake. Therefore, if a voltage that is slightly lower than the prescribed ending voltage is maintained, the battery can often be used. Thus, for example, it is possible for the user to specify intentionally a nickel hydrogen battery, which has a lower ending voltage than that of an actually mounted alkaline battery, so that the lock level can be set to 0.9V, which is lower than the actual 1.2V by 0.3V. Due to this difference, the operable time of the digital camera can be extended longer than the normal time.

Further, the automatic determination of the battery type in Step S220 is executed only when a battery is mounted, and the process after Step S110 of FIG. 2 is not executed. The reason is that the battery-just-on flag is reset in Step S108 immediately after the battery check is carried out for the first time. Namely, the battery type selection process of Steps S216 through S220 cannot be performed while the digital camera is in use, so that the photometry operation and the photographing operation cannot be disturbed.

Note that the present invention is not restricted to a digital camera, but can be applied to other portable electronic apparatuses, including an audio reproduction device.

Although the embodiments of the present invention have been described herein with reference to the accompanying drawings, obviously many modifications and changes maybe made by those skilled in this art without departing from the scope of the invention.

The present disclosure relates to subject matter contained in Japanese Patent Application No. 2005-184552 (filed on Jun. 24, 2005) which is expressly incorporated herein, by reference, in its entirety.

The invention claimed is:

1. A battery check device for a portable electronic apparatus, in which a plurality of types of batteries can be selectively mounted, said battery check device comprising:
    a battery determining processor that determines a type of battery, when said battery is mounted in said portable electronic apparatus;
    a battery check processor that checks the residual battery power in accordance with the determined battery type, for the mounted battery;
    an indicating processor that can indicate said plurality of types of batteries, said indicating processor indicating the determined battery type;

a selecting processor that manually selects a type of battery to be mounted; and a decision processor that manually fixes the mounted battery type selected by said selecting processor, said indicating processor indicating that said portable electronic apparatus recognizes the determined battery type as the type of battery to be mounted, and that a battery type, other than the determined battery type, can be set as the mounted battery type by said selecting processor, wherein, only when an ending voltage of the determined battery type is not the lowest among said plurality of types of batteries, said selecting processor can select a type of battery that has an ending voltage lower than that of the determined battery type.

2. A device according to claim 1, wherein said indicating processor indicates all types of batteries, which can be mounted in said portable electronic apparatus, said indicating processor emphasizing the determined battery type and the mounted battery type, and indicating that said portable electronic apparatus recognizes the emphasized battery type as the mounted battery type when said decision processor is operated.

3. A device according to claim 1, wherein said battery determining processor is actuated only when a battery is mounted in said portable electronic apparatus.

* * * * *